United States Patent [19]
Choi et al.

[11] Patent Number: 5,315,608
[45] Date of Patent: May 24, 1994

[54] HOLMIUM-DOPED SOLID STATE OPTICALLY PUMPED LASER

[75] Inventors: Hong K. Choi; Stephen J. Eglash, both of Concord; Tso Y. Fan, Cambridge; C. David Nabors, Bedford, all of Mass.

[73] Assignee: Massachusetts Institute of Technology, Cambridge, Mass.

[21] Appl. No.: 916,467

[22] Filed: Jul. 17, 1992

Related U.S. Application Data

[63] Continuation-in-part of Ser. No. 880,622, May 8, 1992, Pat. No. 5,251,225.

[51] Int. Cl.[5] ............................................. H01S 3/16
[52] U.S. Cl. ..................................... 372/41; 372/69
[58] Field of Search ..................... 372/41, 69, 70, 75

[56] References Cited

U.S. PATENT DOCUMENTS

| | | | |
|---|---|---|---|
| 3,781,707 | 12/1973 | Hopkins et al. | 331/94.5 |
| 3,786,365 | 1/1974 | Robinson et al. | 331/94.5 |
| 4,701,928 | 10/1987 | Fan et al. | 372/68 |
| 4,761,786 | 8/1988 | Baer | 372/10 |
| 4,847,850 | 7/1989 | Kafka et al. | 372/71 |
| 4,965,803 | 10/1990 | Esterowitz et al. | 372/5 |
| 4,967,416 | 10/1990 | Esterowitz et al. | 372/6 |
| 4,969,150 | 11/1990 | Esterowitz et al. | 372/20 |
| 4,974,230 | 11/1990 | Hemmati | 372/41 |
| 5,017,513 | 4/1992 | Sagie et al. | 372/35 |
| 5,036,520 | 7/1991 | Bowman | 372/41 |
| 5,070,507 | 12/1991 | Anthon | 372/41 |
| 5,088,103 | 4/1990 | Esterowitz | 372/41 |

*Primary Examiner*—Léon Scott, Jr.
*Attorney, Agent, or Firm*—Hamilton, Brook, Smith & Reynolds

[57] ABSTRACT

An eye-safe short pulse room-temperature solid state laser emitting at about 2.1 microns is optically pumped by diode lasers emitting at about 1.9 microns Absorption spectra of Ho ions in YAG (Yttrium Aluminum Garnet) and YLF (Yttrium Lithium Fluoride) host crystals are described. Optical pumping is performed by high-power diode lasers emitting at about 1.91 microns consisting of a GaInAsSb/AlGaAsSb quantum-well active region and AlGaAsSb cladding layers grown on GaSb substrates.

18 Claims, 3 Drawing Sheets

Fig. 1B Ho:YAG LASER

Fig. 1A Tm,Ho:YAG LASER
PRIOR ART

HOLMIUM-DOPED SOLID STATE OPTICALLY PUMPED LASER

GOVERNMENT FUNDING

The Government has rights in this invention pursuant to Contract Number F19628-90-C-0002 awarded by the Department of the Air Force.

RELATED APPLICATIONS

This application is a continuation-in-part of application Ser. No. 07/880,622 filed May 8, 1992 now U.S. Pat. No. 5,251,225, hereinafter referred to as "parent application", incorporated in its entirety herein by reference.

BACKGROUND OF THE INVENTION

A laser is a device which has the ability to produce monochromatic, coherent light through the stimulated emission of photons from atoms, molecules or ions of an active gain medium which have typically been excited from a ground state to a higher energy level by an input of energy. Such a device contains an optical cavity or resonator which is defined by highly reflecting surfaces which form a closed round trip path for light. The active gain medium is contained within the optical cavity.

If a population inversion is created by excitation of the active medium, the spontaneous emission of a photon from an excited atom, molecule or ion undergoing transition to a lower energy state can stimulate the emission of photons of substantially identical energy from other excited atoms, molecules or ions. As a consequence, the initial photon creates a cascade of photons between the reflecting surfaces of the optical cavity which are of substantially identical energy and exactly in phase. This multiplication effect causes light inside the cavity to undergo gain, which, along with the feedback provided by the resonator, constitutes a laser oscillator. A portion of this cascade of photons is then discharged out of the optical cavity, for example, by transmission through one or more of the reflecting surfaces of the cavity. These discharged photons constitute the laser output.

Excitation of the active medium of a laser can be accomplished by a variety of methods. However, the most common methods are optical pumping, use of an electrical discharge, and the passage of an electric current through the p-n junction of a semiconductor laser.

Semiconductor lasers contain a p-n junction which forms a diode, and this junction functions as the active medium of the laser. Such devices, which are also referred to as diode lasers, are typically constructed from materials such as gallium arsenide and aluminum gallium arsenide alloys. The efficiency of such lasers in converting electrical power to output radiation is relatively high and, for example, can be in excess of 40 percent.

The use of flashlamps, light-emitting diodes and laser diodes to optically pump or excite a solid lasant material is well-known. Lasant materials commonly used in such solid state lasers include crystalline or glassy host materials into which an active material, such as trivalent neodymium ions, is incorporated. By way of example, when neodymium-doped $Y_3Al_5O_{12}$, referred to as YAG, is employed as the lasant material in an optically pumped solid state laser, it can be pumped by absorption of light having a wavelength of about 808 nm and can emit light having a wavelength of 1064 nm.

It is possible to operate solid state lasers to produce temporally short pulses using the techniques of Q-switching or mode locking. The term "Q" refers to the ratio of energy stored in a resonant cavity to the energy loss per cavity round trip. In Q-switching, a controllable loss-producing device (the "Q-switch") is inserted into the laser cavity which inhibits laser oscillation. When the Q-switch is switched to its low-loss mode, the laser is suddenly able to oscillate, and a substantial fraction of the stored energy of the gain medium is released in a very short time, producing very high peak powers. Q-switches may be based on acousto-optical, electro-optical, or magneto-optical effects, or may be mechanical.

In the related technique of mode locking, a modulator, typically an acousto-optical device, is placed in the cavity to modulate the round-trip phases or amplitude of a laser cavity at frequency equal to the inverse of the cavity round-trip time. This has the effect of causing the longitudinal modes of the laser to phase lock, and forcing the laser output to have the form of a train of very short pulses, whose individual widths are of the order of the inverse of the gain bandwidth of the gain medium, and whose repetition rate is the inverse of the cavity round-trip time. It is also possible to achieve mode locking by a variety of techniques wherein the cavity loss or effective output coupling is caused to be a nonlinear function of the circulating power.

Lasers, particularly solid state lasers, operable at room temperature and capable of generating optical radiation in the eye-safe wavelength band above about 2 microns, are highly desirable for a number of important military and civilian applications.

Such military applications include use as rangefinders, target designators, and battlefield simulators. Civilian applications of eye-safe lasers include laser surgery and laser radars for wind and turbulence sensing. Most of these applications require short-pulse ($\leq 10$ ns) operation, such as produced by Q-switched or mode-locked lasers, as described above. However, there are a number of problems with existing eye-safe solid state lasers in generating short pulses at room temperature.

The known commercially available existing eye-safe solid state lasers utilize either optically pumped host crystals doped with thulium (Tm) emitting near 2.0 microns or Tm-sensitized holmium (Ho) emitting near 2.1 microns. Good continuous wave (cw) performance with high optical-to-optical conversion efficiency has been achieved for Tm and co-doped Tm,Ho lasers because each absorbed pump photon results in two ions (rather than one) with an electron in the upper laser level. However, the short pulse, Q-switched performance of these lasers is inadequate.

SUMMARY OF THE INVENTION

The Q-switched operation of Tm lasers has been limited to relatively long pulses ($>100$ ns) because optical damage is observed for shorter pulses. Optical damage is a fundamental limitation for these lasers because the saturation fluence (defined by photon energy/stimulated emission cross-section) is large ($\sim 50$ J/cm$^2$). Good efficiency requires that the intracavity fluence be on the order of the saturation fluence, but typical damage thresholds for optical components for 10-ns pulses are only 20–30 J/cm$^2$.

Although the co-doped Tm,Ho lasers have a lower saturation fluence (~10 J/cm$^2$), and hence are more promising for short-pulse generation, their room-temperature performance is poor. In this system, as shown in FIG. 1a, an AlGaAs diode laser emitting at ~0.78 microns pumps the Tm ions ($^3H_6 \rightarrow ^3F_4$) and the absorbed energy is transferred to Tm $^3H_4$. The energy stored in Tm $^3H_4$ is then partially transferred to Ho ions, and laser gain is provided by a transition between Ho energy levels ($^5I_7 \rightarrow ^5I_8$). There are two basic problems with the Tm,Ho laser. First, at room temperature the energy transfer from Tm $^3H_4$ to Ho $^5I_7$ is incomplete. Therefore, the laser either operates inefficiently with a single pulse or generates multiple pulses. A single Q-switched pulse extracts energy from the excited Ho ions but not from the Tm ions that are still excited. More than ~10 μs after the first pulse, additional energy is transferred from Tm to Ho, which might then be extracted in a second pulse. The second problem is that, the high excitation, upconversion process between excited Tm $^3H_4$ and Ho $^5I_7$ ions reduces the effective energy storage time to less than 1 ms, compared with the Ho upper-state lifetime of 7 ms. This short effective energy storage time increases the laser threshold and also the pump power required to achieve a given output energy. Although both of these problems are less severe at reduced temperatures, room-temperature operation is highly desirable or even essential for many potential applications of short-pulse eye-safe lasers.

As described above, a laser comprises an amplifying gain medium, a means to 'pump' or supply energy to the gain medium, and a resonant cavity. In accordance with the invention, Ho ions when doped into suitable host crystals acts as an amplifying gain medium and are pumped for laser action at 2.0-2.2 μm. The laser cavity is formed from either external mirrors or by a combination of external mirrors and reflective coatings applied directly to the Ho-doped crystal. Laser diodes formed of GaInAsSb/AlGaAsSb, as described in the parent application, are suitable sources for pumping such Ho doped solid state lasers. Pumping Ho lasers at 1.8-2.0 μm using such diode lasers, provides a number of benefits not presently available in the art. These benefits include:

(a) short-pulse Q-switched operation;
(b) higher efficiency through realization of full upper state energy;
(c) higher Q-switched energy through realization of full upper state lifetime; and
(d) improved high-power operation by reduction of thermal loading as compared to Tm-sensitized systems. Q-switched and mode-locked operation of 1.8-2.0 μm diode pumped Ho lasers are also considered as part of the invention.

DETAILED DESCRIPTION OF THE INVENTION

Figure 2:
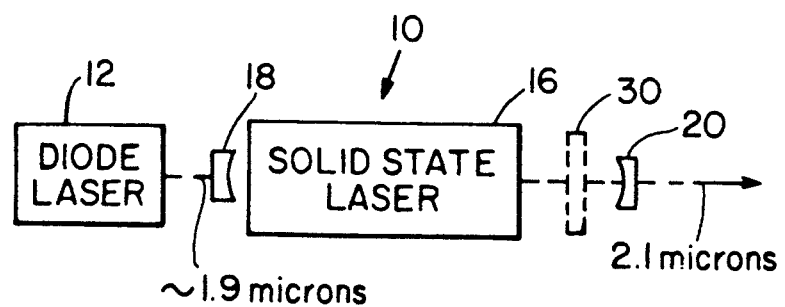
FIG. 2 is a schematic representation of the optically pumped solid state laser of the invention.

The invention will now be described, in detail, in connection with the drawings. FIG. 2 illustrates, in schematic form, a solid state optically pumped laser system 10 of the invention comprising, in general, a diode laser 12 emitting radiation at λ1 of about 1.9 microns and a solid state laser 14 which is end or longitudinally pumped by diode laser 12. Laser 14 consists of a rod of Ho-doped solid state host material 16, such as YAG or YLF disposed in an optical cavity formed between two partially reflective mirrors, input mirror 18 and an output mirror 20.

Figure 1:
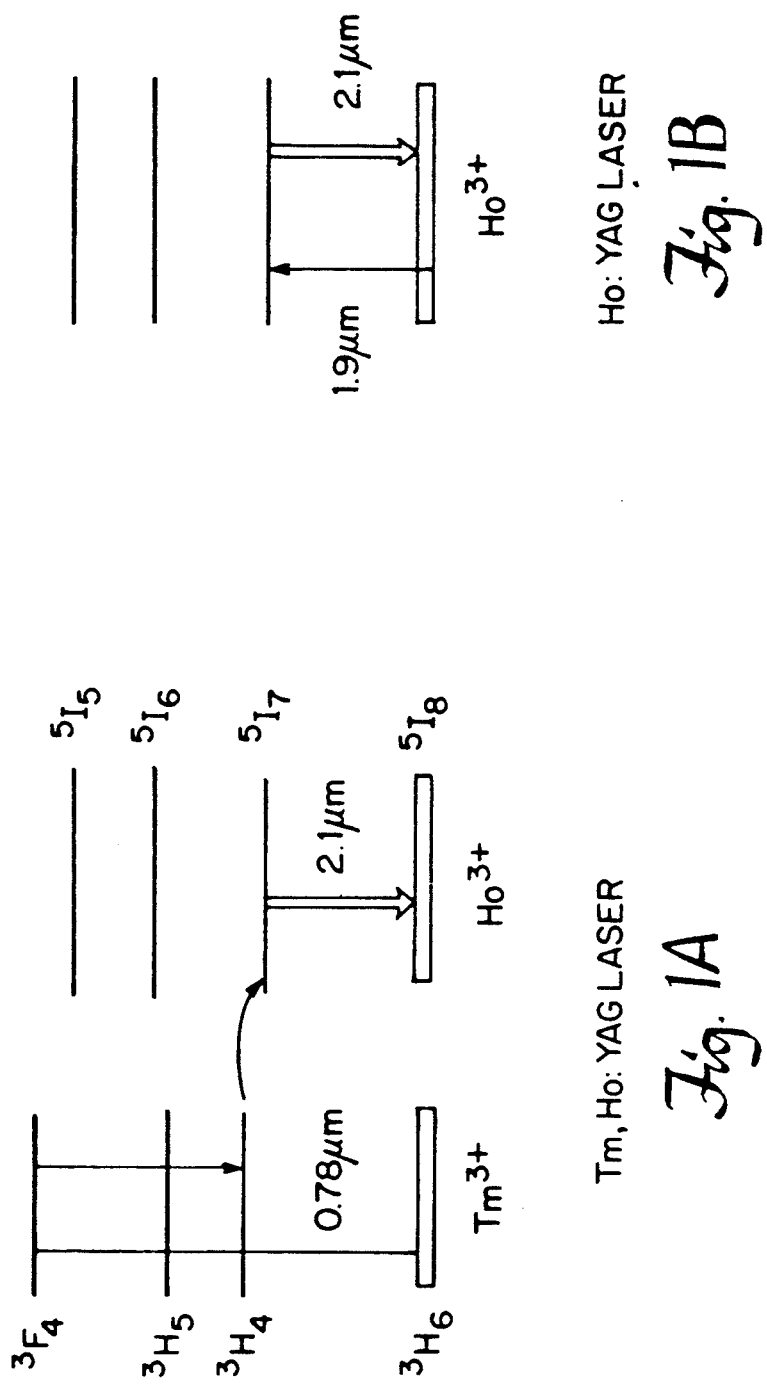
FIG. 1A and 1B are plots of the energy levels of a Tm Ho:YAG laser pumped at 0.78 μm and a Ho:YAG laser pumped at 1.9 μm, respectively.

Radiation at λ1 from pump source 12 is coupled through input lens 22 to one end of rod 16 of Ho-doped solid state host or lasant material and is absorbed by Ho ions ($^5I_8 \rightarrow ^5I_7$) in the rod 16 causing stimulated emission of photons ($^5I_7 \rightarrow ^5I_8$) at an energy level corresponding to a wavelength λ2 of about 2.1 microns through output mirror 20 (See FIG. 1B).

Diode laser 12 is a quantum well laser comprised of alternate layers of the quaternary compounds GaInAsSb and AlGaAsSb forming an active region which is disposed between doped p and n type upper and lower cladding layers formed of AlGaAsSb, respectively.

Optionally, a Q-switch or mode-locking device 30 is provided in the laser cavity for the purposes enumerated in the description of the Background of the Invention.

Figure 3:
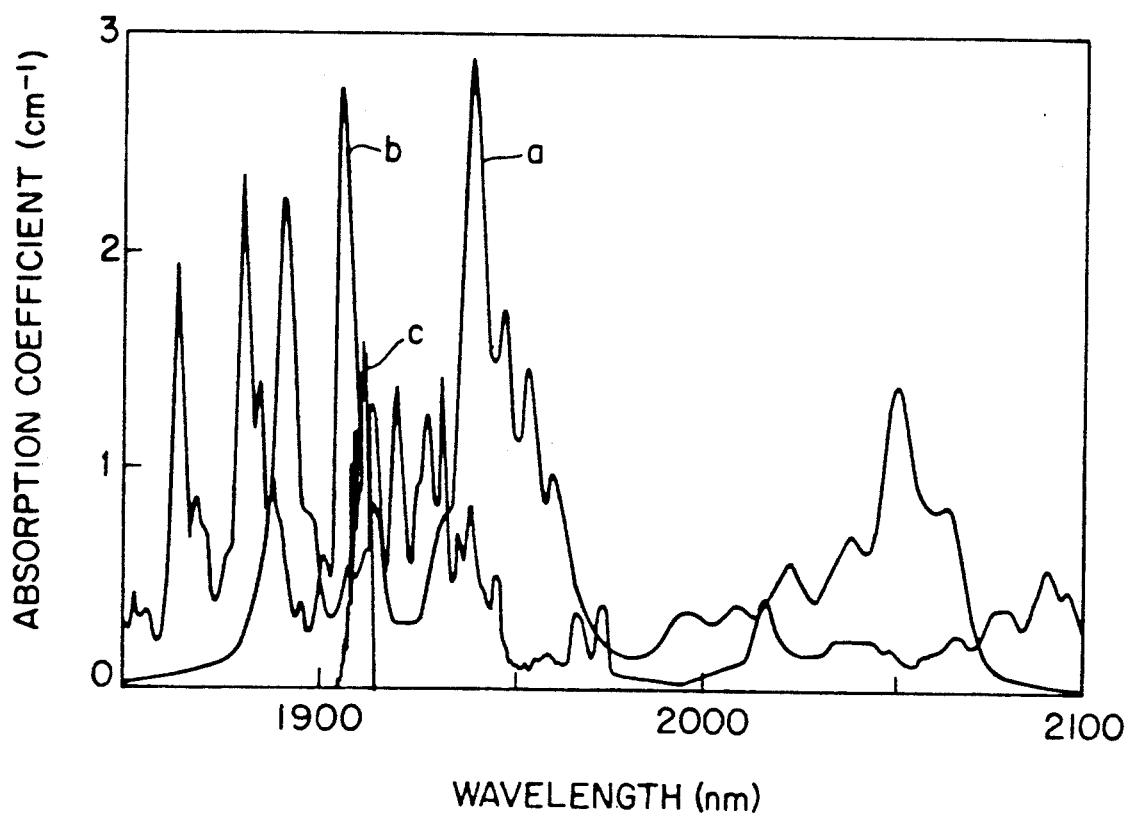
FIG. 3 is a plot of the absorption spectrum of 2% doped a) Ho:YLF, b) 2% doped Ho:YAG solid state lasers and the output emission spectra of c) a GaInAsSb quantum well diode laser.

The absorption spectra near 2 microns of Ho:YLF and Ho:YAG is shown in FIG. 3, curves a and b, respectively. From this spectra, it may be seen that the strongest absorption is at 1.91 microns for Ho:YAG and 1.95 microns for Ho:YLF. By eliminating the use of Tm to absorb the pump radiation at 0.78 microns, the system of the invention solves the multi-pulsing and upconversion problems inherent in Tm,Ho solid state lasers. Compared with Tm solid state lasers, the present laser has the advantage of lower saturation fluence. The present system should also have the advantage of reduced thermal loading of the gain medium by a factor of three to five compared with Tm,Ho or Tm lasers pumped by conventional 0.78-um diodes. The reduction in thermal loading should result in reduced thermo-optic distortion, higher output power, and higher operating temperature.

Figure 4:
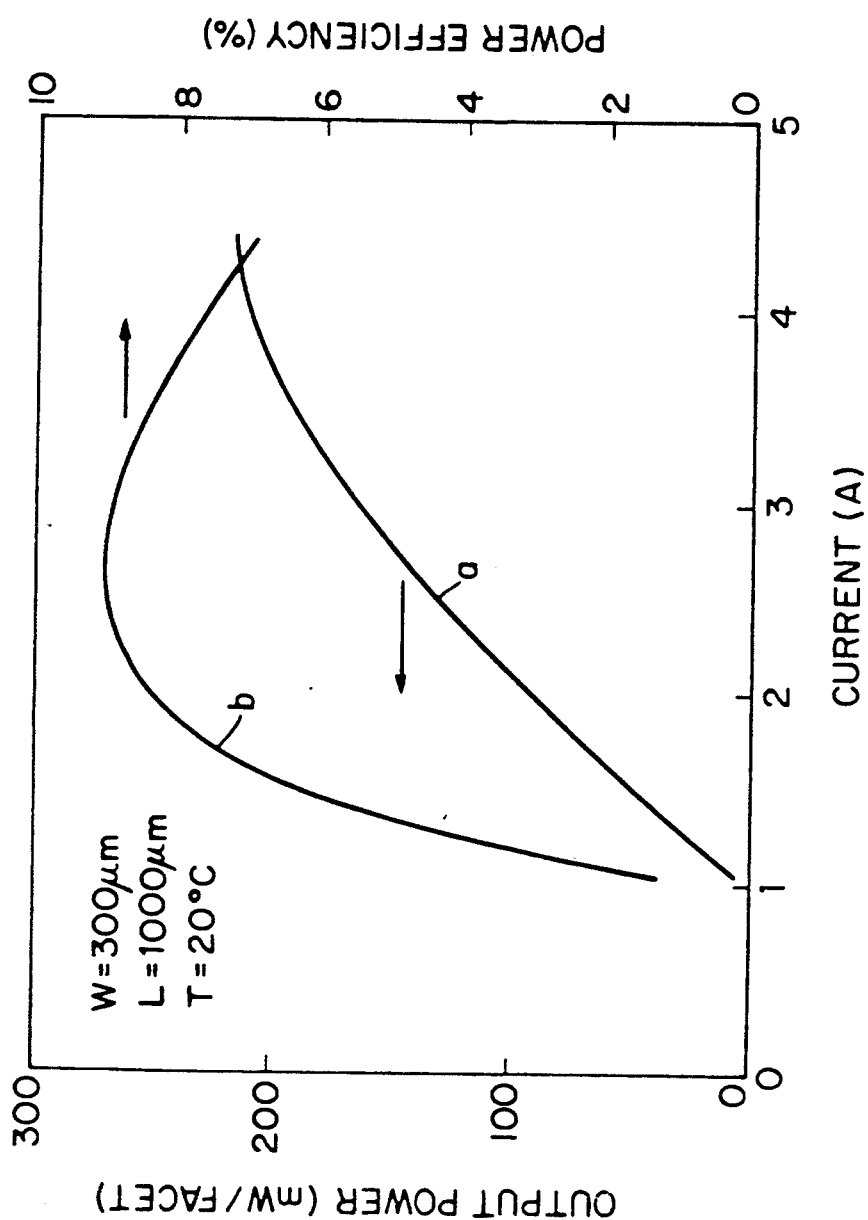
FIG. 4 is a plot of output power in milliwatts per facet a) and power efficiency b) versus current in amperes for cw operation of a GaInAsSb/AlGaAsSb 1.9 micron quantum well diode laser and wherein W, L & T are cavity width, length and heatsink temperature, respectively.

The high-power quantum-well diode laser 12 output spectrum is shown in FIG. 4, curve a, and peaks at 1.9 microns. The maximum cw output power of this diode laser at room temperature is 220 mW/facet (see FIG. 4). The laser consists of GaInAsSb quantum wells and AlGaAsSb barrier and confining layers grown on GaSb substrates. For pulsed room-temperature operation, the lowest threshold current density is 260 A/cm$^2$, and the highest differential quantum efficiency is 70%. In addition, the change in threshold current with temperature is much smaller for quantum-well lasers than double heterojunction (DH) lasers.

Note that the term "about" used in connection with the wavelength of the Ho laser 16 and the pump laser 12 is meant to encompass the ranges of 2.0-2.1 μm and 1.8-2.0 m, respectively.

EQUIVALENTS

This completes the description of the preferred embodiment of the invention. Those skilled in the art will recognize, or be able to ascertain, using no more than routine experimentation, many equivalents to the specific embodiments of the invention described herein For example, while the invention has been described in connection with the longitudinal pumping, side-pumping is also contemplated. Similarly, suitable host crystals for Ho doping include (but are not limited to):

| | |
|---|---|
| $Y_3Al_5O_{12}$ | "YAG" |
| $LiYF_4$ | "YLF" |
| $LiHoF_4$ | |
| $YVO_4$ | "YVO" |
| $La_2Be_2O_5$ | "BEL" |
| $Gd_3Sc_2Al_3O_{12}$ | "GSAG" |
| Fluoride Glasses | |
| Silicate Glasses | |
| $YAlO_3$ | "YALO" |
| $Gd_3Sc_2Ga_3O_{12}$ | "GSGG" |
| $CaF_2$ | |
| $Ca_5(PO_4)_3F$ | "FAP" |
| $Gd_3Ga_5O_{12}$ | "GGG" |

Ho concentrations between 1% to 10% are within the contemplated range of the invention.

These and all other equivalents are intended to be encompassed by the following claims.

We claim:

1. An optically pumped solid state laser system comprising:
   a) a solid state host medium doped with a holmium activator and enclosed in an optical cavity; and
   b) a pump source means external to said medium for generating optical radiation within a wavelength band of from 1.8 to 210 microns for direct absorption by said holmium activator to stimulate emission of light at a wavelength of from 2.0 to 2.2 microns.

2. The solid-state laser system of claim 1 wherein the pump source means is comprised of a quantum-well diode laser.

3. The solid-state laser system of claim 2 wherein the quantum-well diode laser is formed of alternate layers of GaInAsSb and AlGaAsSb.

4. The laser system of claim 1 wherein the host medium is YAG and wherein the dopant Ho has a molecular weight and the percent by molecular weight of the dopant Ho is in the range of 1-10%.

5. The laser system of claim 1 wherein the doped medium is longitudinally end pumped.

6. The laser system of claim 1 wherein the optical cavity is formed by reflective mirrors at each end of the medium.

7. The laser system of claim 1 wherein the host medium is comprised of YLF.

8. An optically pumped solid state laser system comprising:

a) a quantum well laser diode formed of alternate layers of GaIn AsSb and AlGaAsSb disposed between cladding layer for generating optical pump radiation in the range of about 1.9 microns;
   b) a solid state laser formed of a host medium which is doped with a Ho activator disposed within an optical cavity in the path of said radiation which activator directly absorbs said pump radiation and emits photons at a wavelength of about from 2.0 to 2.2 microns.

9. The system of claim 8 wherein the medium is comprised of YAG.

10. The laser system of claim 8 wherein the host medium is comprised of YLF.

11. A method of forming an optically pumped solid state laser system comprising the steps of:
    a) doping a solid state host medium with a Ho activator and enclosing the medium in an optical cavity;
    b) pumping the Ho activator with a pump source external to the cavity with optical radiation at a wavelength from 1.8 to 2.0 microns which is within a frequency band absorbed by Ho such that the Ho is stimulated into emission and generates light at a wavelength of from 2.0 to 2.2 microns.

12. The method of claim 1 wherein pumping the medium comprises pumping the medium along a longitudinal axis.

13. The method of claim 11 wherein the optical cavity is formed by providing reflective mirrors at each end of the medium.

14. The method of claim 11 wherein a Q-switch is provided in the cavity and the laser system is operated in a Q-switched mode for short-pulse, high-power output.

15. The method of claim 11 wherein the doped medium is side pumped.

16. A method of forming a solid state laser system comprising the steps of:
    a) forming a quantum well laser diode of alternate layers of GaInAsSb and AlGaAsSb disposed between cladding layers and generating optical radiation from said diode in the range of from 1.8 to 2.0 microns;
    b) forming a solid state laser of a host medium with a holmium activator and disposing the medium within an optical cavity in the path of said radiation and absorbing said radiation by said activator to stimulate photon emission by said activator at a wavelength of from 2.0 to 2.2 microns.

17. The system of claim 16 wherein the medium is comprised of YAG.

18. An optically pumped solid state laser system comprising:
    a) a solid state host medium doped with holmium activator ions and enclosed in an optical cavity;
    b) a light source to optically pump the medium by providing light at a frequency of from 1.8 to 2.0 microns which is primarily absorbed by the holmium ions to cause the laser system to base at a wavelength in the range from 2.0 to 2.2 microns.

* * * * *

UNITED STATES PATENT AND TRADEMARK OFFICE
CERTIFICATE OF CORRECTION

PATENT NO. : 5,315,608
DATED : May 24, 1994
INVENTOR(S) : Hong K. Choi, Stephen J. Eglash, Tso Y. Fan and C. David Nabors It is certified that error appears in the above-indentified patent and that said Letters Patent is hereby corrected as shown below:

Col. 5, line 38, delete "210" and insert --2.0--.

Col. 6, line 2, delete "GaIn AsSb" and insert --GaInAsSb--.

Col. 6, line 59, delete "base" and insert --lase--.

Signed and Sealed this

Twentieth Day of September, 1994

Attest:

BRUCE LEHMAN

Attesting Officer

Commissioner of Patents and Trademarks